United States Patent [19]

Cleveland

[11] Patent Number: 5,237,288
[45] Date of Patent: Aug. 17, 1993

[54] RF POWER AMPLIFIER LINEARIZATION

[75] Inventor: John F. Cleveland, Marysville, Wash.

[73] Assignee: SEA, Inc., Mountlake Terrace, Wash.

[21] Appl. No.: 894,735

[22] Filed: Jun. 5, 1992

[51] Int. Cl.⁵ .............................................. H03F 1/34
[52] U.S. Cl. .................................. 330/107; 330/149; 455/63
[58] Field of Search ........................ 330/107, 149, 294; 332/159; 455/63, 126

[56] References Cited

U.S. PATENT DOCUMENTS

| | | |
|---|---|---|
| 2,634,339 | 4/1953 | Bonadio . |
| 3,889,060 | 6/1975 | Goto et al. . |
| 4,126,828 | 11/1978 | Kumagai . |
| 4,383,334 | 5/1983 | Epsom . |
| 4,408,352 | 10/1983 | Dudding . |
| 4,416,017 | 11/1983 | Jasper et al. . |
| 4,549,146 | 10/1985 | Cowans et al. . |
| 4,554,514 | 11/1985 | Whartenby et al. . |
| 4,571,553 | 2/1986 | Yokoyama . |
| 4,580,105 | 4/1986 | Myer . |
| 4,672,452 | 6/1987 | Corbel et al. . |
| 4,739,280 | 4/1988 | Noro . |
| 4,929,906 | 5/1990 | Voyce et al. . |
| 5,029,238 | 7/1991 | Gehr . |
| 5,066,923 | 11/1991 | Gailus et al. ................. 330/107 |

Primary Examiner—James B. Mullins
Attorney, Agent, or Firm—Hughes & Multer

[57] ABSTRACT

An apparatus for generating an amplified signal from an input signal. The apparatus comprises: (a) a phase-shifting circuit for shifting the phase of a feedback signal derived from the amplified output signal in response to a control signal; (b) a differencing circuit for generating an output signal based on the input signal and the phase-shifted feedback signal; (c) a filter for filtering the output signal; and (d) a power amplifier for amplifying the filtered output signal to obtain the amplified output signal. The apparatus further comprises a CPU and DAC for generating a control signal corresponding to a control signal value associated with a frequency range including the operating frequency from a table associating predetermined control signal values with frequency ranges in the portion of the frequency spectrum in which the amplifier is designed to operate. Phase shift introduced by the filter is thus compensated for by the phase-shifting circuit to maintain negative feedback and thus system stability.

17 Claims, 8 Drawing Sheets

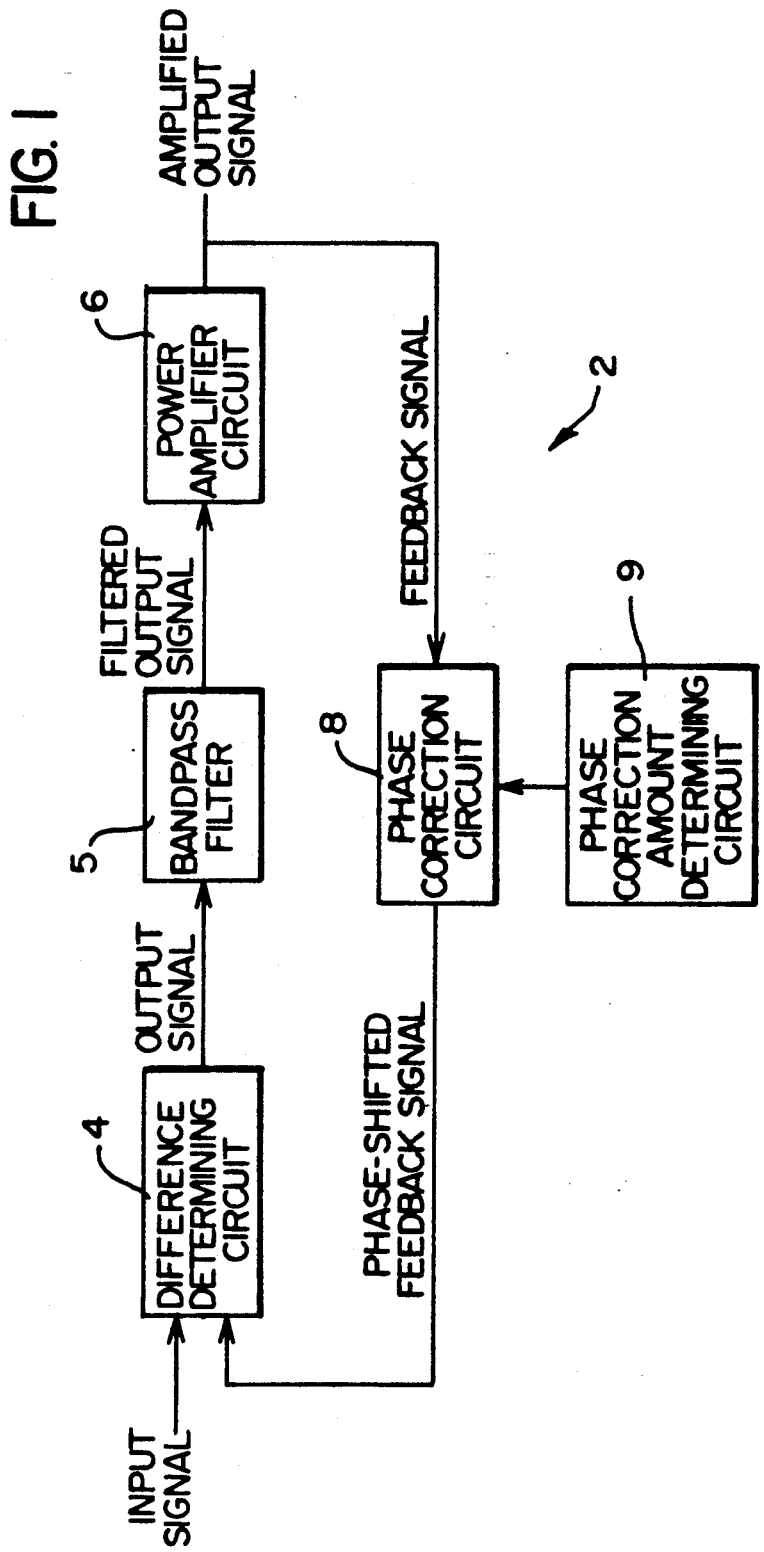

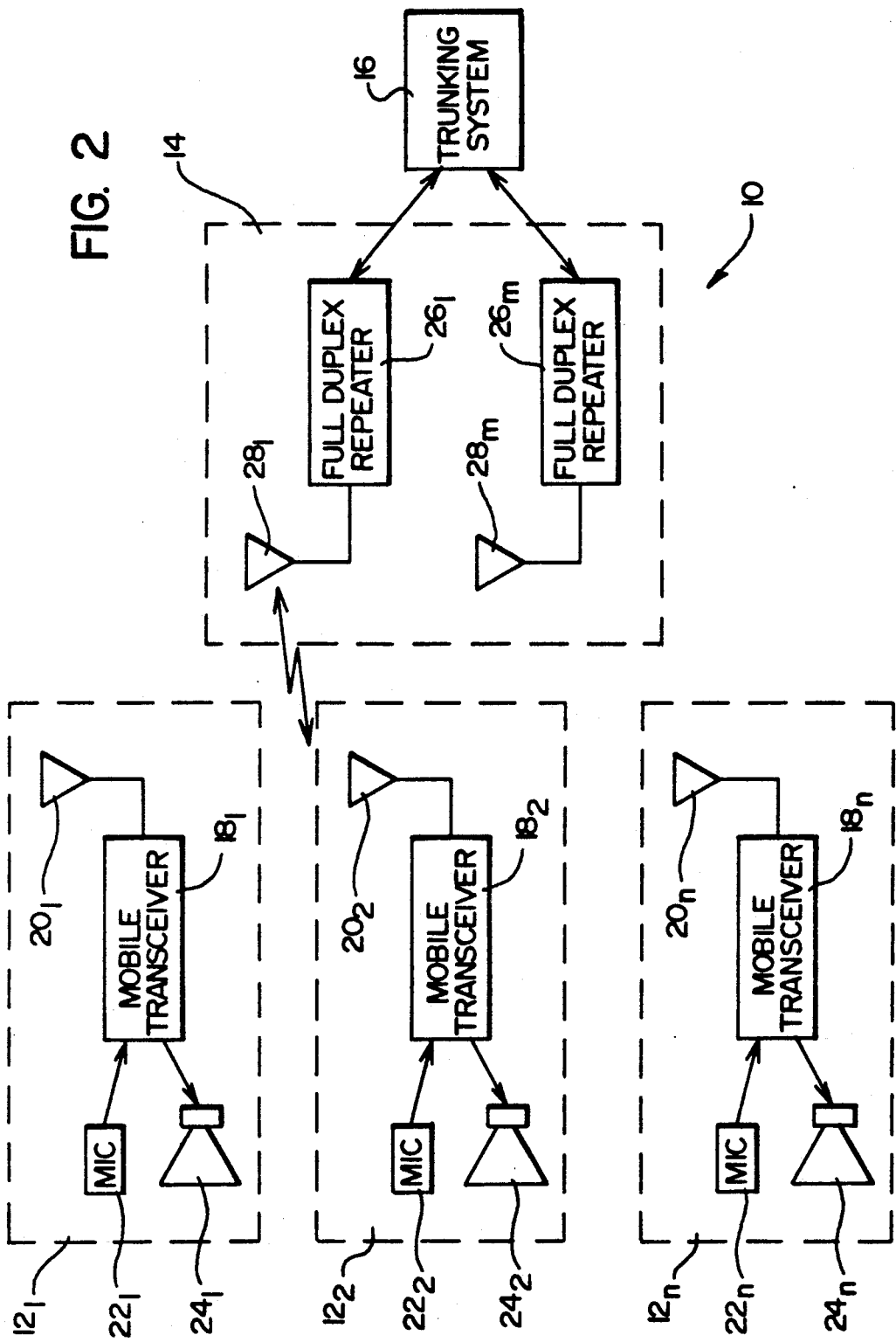

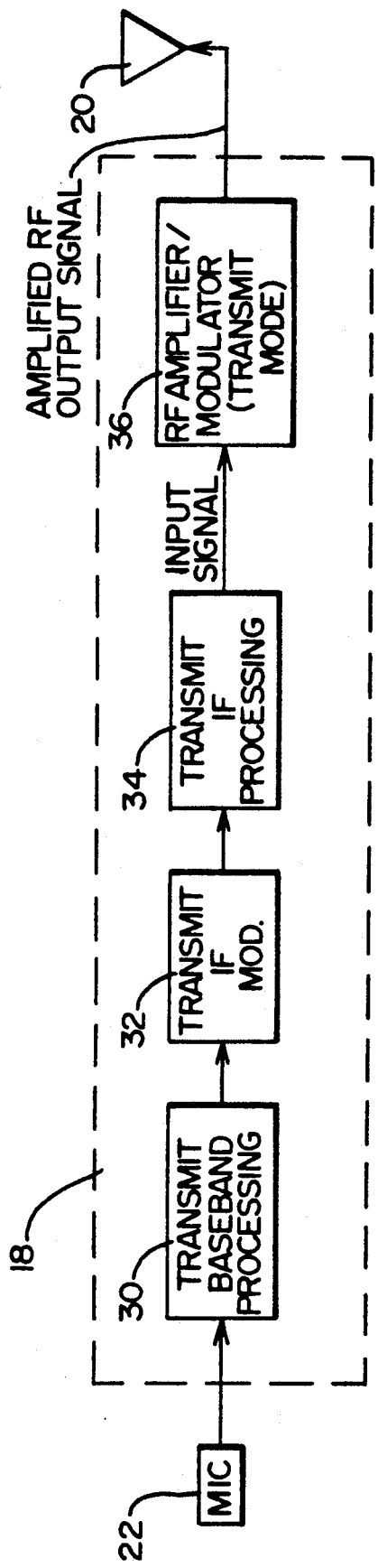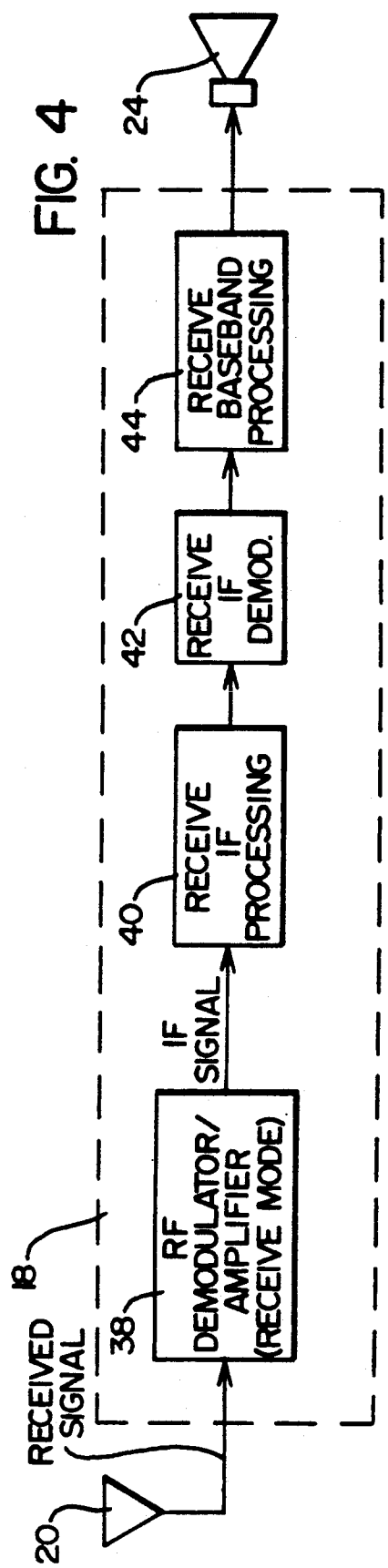

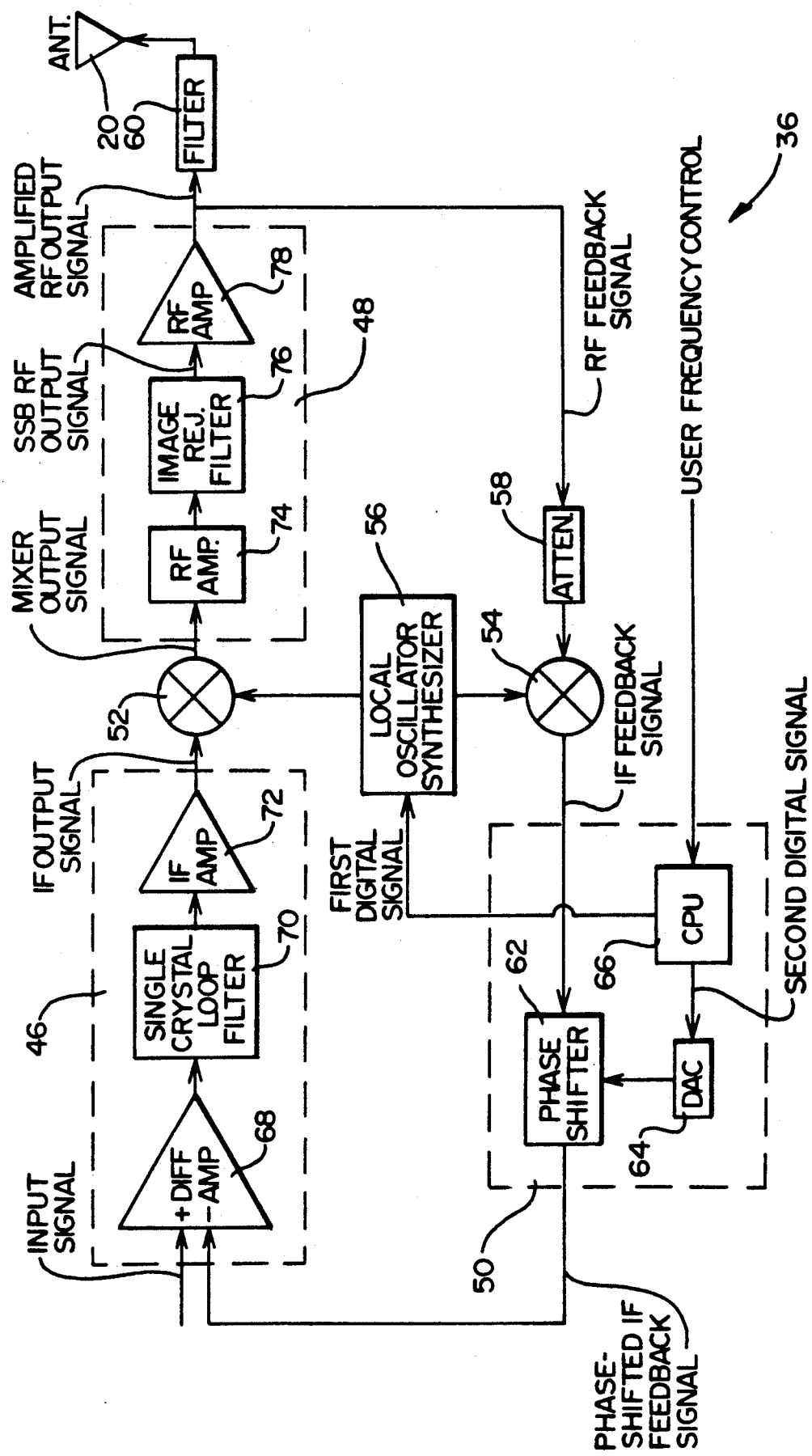

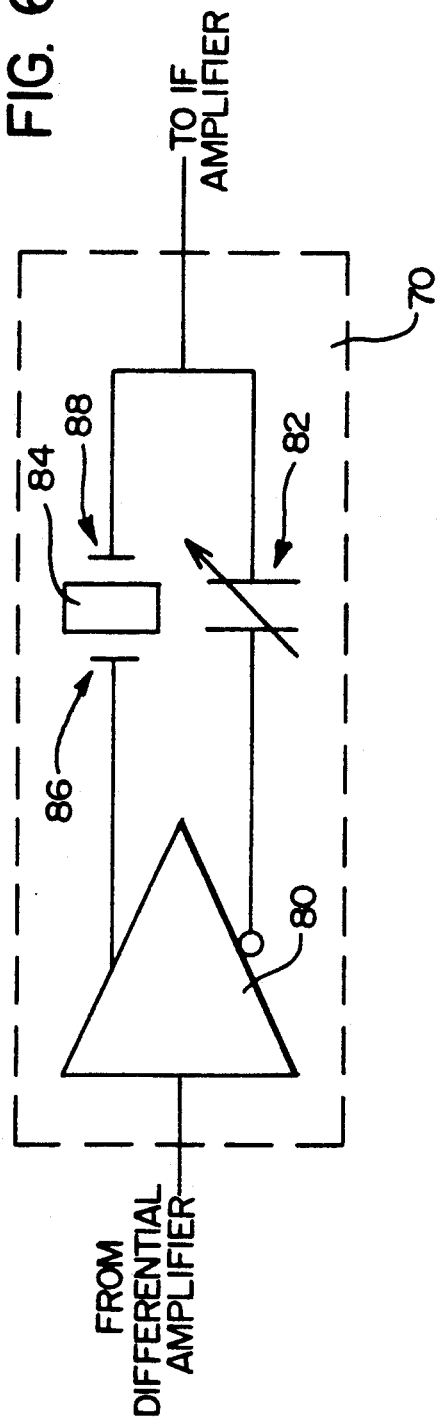
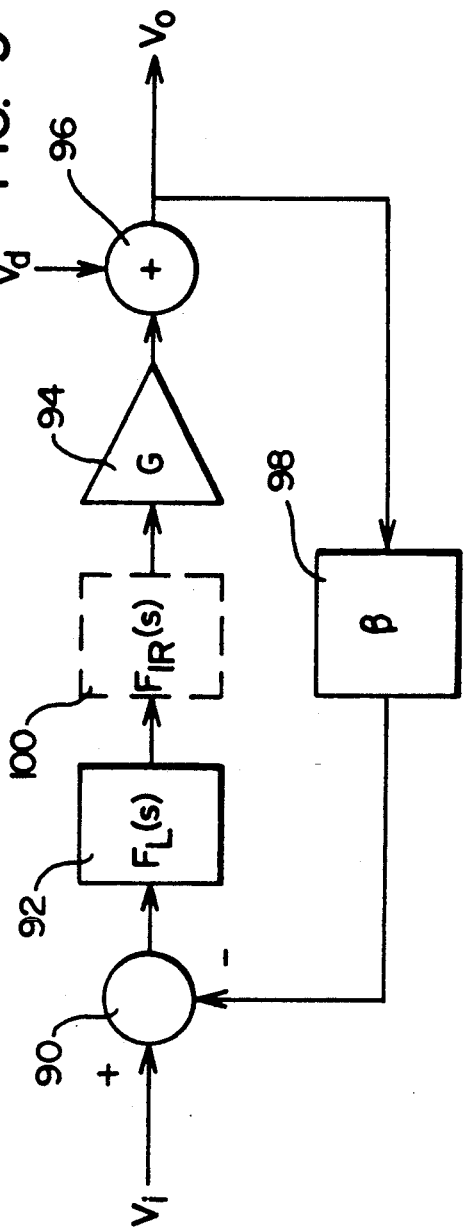

RF POWER AMPLIFIER LINEARIZATION

TECHNICAL FIELD

The present invention relates to RF power amplifiers and, more particularly, to techniques for linearizing RF power amplifiers used in single sideband radio transceivers designed for use in a trunked communications system.

BACKGROUND OF THE INVENTION

Recognizing that the radio spectrum is finite, the Federal Communications Commission (FCC) encourages the development and use of technology that makes efficient use of the radio spectrum. To this end, the FCC has recently allocated a region of the radio spectrum from 220-222 MHz for the purpose of spurring the development and acceptance of new narrowband technologies. The 220-222 MHz range allocated by the FCC is divided up into 400 5 kHz-wide frequency ranges paired to provide 200 channels.

The present invention relates to a spectrum efficient narrowband technology designed to operate efficiently in this 220-222 MHz range. Specifically, the present invention will be discussed in detail below in the context of amplitude modulated RF signals such as those transmitted by single sideband (SSB) two-way radios operating in the 220-222 Mhz frequency range; however, it should be clear that the principles of the present invention may be adapted to operate efficiently in other systems requiring amplification of an RF signal and in frequency ranges other than 220-222 Mhz. Accordingly, the scope of the present invention should be determined with reference to the claims appended hereto and not the following detailed discussion.

Non-linearities in radio frequency (RF) power amplifiers used to amplify SSB signals introduce distortion into these signals. More specifically, RF power amplifiers create undesired intermodulation distortion (IMD) products that result in the amplified RF output signal not being a faithful reproduction of the RF input signal. Odd-order IMD is particularly bothersome because these signals fall close in frequency on either side of the desired RF output signal and thus cannot readily be removed by RF filtering.

Furthermore, to increase efficient use of the frequency spectrum, SSB signals are often broadcast as part of a channelized system in which a first SSB signals may be broadcast in a channel adjacent to a second SSB signal. The odd-order IMD mentioned above can fall inside an adjacent channel, thus interfering with the SSB signal in the adjacent channel. The level of IMD that falls into adjacent channels is strictly regulated throughout the world to increase the reliability of channelized radio systems.

Accordingly, in order to develop an SSB system that both works properly and meets government regulations, RF power amplifiers must be as linear as possible across their operating frequency range.

Generally speaking, attempts to linearize power amplifiers may be categorized as feedback control, feedforward control, or predistortion. The most common method of amplifier linearization is feedback control. While feedback control works well at relatively lower frequencies, feedback control does not work well at higher frequencies. At higher frequencies, feedforward and predistortion are generally used. Of the foregoing linearization methods, feedback systems are preferable for the type of RF power amplifier discussed herein because they are closed loop systems that are less susceptible to changes caused by aging and environmental factors.

The present invention thus relates to feedback type control circuits for RF power amplifiers. Negative feedback control systems operate basically as follows. A differencing or error stage is provided prior to the RF amplifier. The output of the amplifier is sampled and fed back to the differencing stage. The differencing stage takes the difference between the fed back signal and the original input signal. A feedback system as just described reduces the amount of net operating gain but also reduces IMD relative to the desired signal.

Additionally, in the present application, it is desirable to place a bandpass filter prior to the amplifier to be linearized. This allows the use of a low power bandpass filter that is compact in size, which is important for use in mobile radio systems.

However, in order to operate correctly, negative feedback systems as described above require that the feedback signal be at or near 360° (or integer multiples thereof) out of phase with the input signal. Providing a bandpass filter in the feedback loop before the amplifier introduces relatively large phase delay in the signal to be amplified that renders the feedback loop unstable.

PRIOR ART

The following patents were discovered in a search conducted on behalf of the applicant.

Examples of feedback control systems for amplifier circuits may be found in the following U.S. Pat. Nos. (a) 4,929,906 29 May 1990 to Voyce et al.; (b) 4,739,280 issued 19 Apr. 1988 to Noro; (c) 4,672,452 issued 9 Jun. 1987 to Corbel et al.; (d) 3,889,060 issued 10 Jun. 1975 to Goto et al; and (e) 4,571,553 issued 18 Feb. 1986 to Yokohama.

Examples of feedforward type amplifier linearization systems are discussed in the following U.S. Pat. Nos.: (a) 2,634,339 issued 22 Oct. 1949 to Bonadio; (b) 4,580,105 issued 1 Apr. 1986 to Myer; (c) 4,549,146 issued 22 Oct. 1985 to Cowans et al.

An example of a predistortion circuit for linearizing the output of an amplifier is found in U.S. Pat. No. 4,554,514 issued issued 19 Nov. 1985 to Whartenby et al.

Of the foregoing, the Voyce and Myer patents generally relate to RF amplifiers.

The Voyce et al. patent discloses a system in which a received RF input signal is first down-converted to an IF input signal and then up-converted to an RF output signal that is amplified by an RF power amplifier. The amplified RF output signal is sampled, down-converted to IF, and subtracted from the IF signal. To improve loop stability, the bandpass filter is placed outside of the loop after the RF power amplifier, undesirably requiring the use of a high power bandpass filter. The phase of the feedback signal is adjusted to compensate for the phase shift introduced in the feedback loop.

The Myer patent discloses a feedforward amplifier linearization system. Feedforward systems such as that disclosed in Myer are open loop systems that are unable to compensate for system parameter variations caused by age and environmental changes.

The linearization systems taught by the remaining patents listed above are insufficient for the present purposes because they are not designed to operate with RF power amplifiers such as those used in SSB systems and/or they are complex and thus expensive to produce.

The following patents are less relevant than those listed above and are disclosed herein as background.

U.S. Pat. No. 4,126,828 issued 21 Nov. 1978 to Kumagai discloses a device for reducing IMD but does not disclose an RF amplifier linearization system per se.

U.S. Pat. Nos. 4,408,352 issued 4 Oct. 1983 to Dudding and 4,383,334 issued 10 May 1983 to Epsom disclose mixers designed to reduce IMD but are not related to control systems for linearizing RF power amplifiers.

U.S. Pat. No. 4,416,017 issued 15 Nov. 1983 to Jasper et al. discloses a circuit for attenuating a signal that interferes with a desired Loran C signal but does not teach a control system for linearizing an RF power amplifier.

U.S. Pat. No. 5,029,238 issued 2 Jul. 1991 to Gehr discloses placing a filtering circuit between intermediate frequency (IF) and audio stages of a radio receiver. This patent does not related to a system for linearizing RF amplifiers.

OBJECTS OF THE INVENTION

In view of the foregoing, it is apparent that an important object of the present invention is to provide an improved system for linearizing RF power amplifiers.

Another important, but more specific, object of the present invention is to provide an RF amplifier linearization system having a favorable mix of the following factors:

a. substantially reducing intermodulation distortion;
b. allows placement of a bandpass filter prior to the RF amplifier;
c. meeting radio frequency bandwidth emission limits;
d. employing a closed loop system that remains stable with age and minimizes the effect of changing environmental conditions;
e. minimizing the circuit complexity and cost associated with linearizing the amplifier;
f. operating efficiently in the 220-222 MHz range allocated by the FCC for the development of narrowband technologies; and
g. efficiently amplifying an SSB signal to be transmitted.

SUMMARY OF THE INVENTION

These and other objects are achieved by the present invention, which basically comprises: (a) phase-shifting means for shifting the phase of a feedback signal derived from an amplified output signal in response to a control signal; (b) differencing means for generating an output signal based on the input signal and the phase-shifted feedback signal; (c) filtering means for filtering the output signal; and (d) power amplifying means for amplifying the filtered output signal to obtain the amplified output signal.

Preferably, the apparatus further comprises control signal generating means for so generating the control signal according to a control signal value that the phase shifting means shifts the phase of the feedback signal as appropriate for an operating frequency of the output signal. The control signal generating means preferably comprises means for selecting the control signal value associated with a frequency range including the operating frequency from a table associating predetermined control signal values with frequency ranges in the portion of the frequency spectrum in which the amplifying means is designed to operate.

The system described above successfully employs negative feedback to linearize an amplifier in which a bandpass filter that introduces severe phase shift is included in the feedback loop. The bandpass filter may thus be placed before the RF power amplifier, and a high power bandpass filter is not required.

The present invention may also be embodied in a linearized RF power amplifier/modulator for generating an amplified single sideband RF output signal from an IF input signal. In this case, the present invention comprises: (a) differencing means for generating an IF output signal based on an IF input signal and a phase-shifted IF feedback signal; (b) oscillating means for generating an RF mixing signal; (c) first mixing means for mixing the IF output signal with the RF mixing signal to generate an RF mixer output signal; (d) first filter means for filtering the RF mixer output signal to obtain a single sideband RF output signal; (e) means for amplifying the single sideband RF output signal; (f) means for generating an RF feedback signal based on the amplified RF output signal; (g) second mixing means for mixing the RF feedback signal with the mixing signal to generate an IF feedback signal; and (h) means for shifting the phase of the IF feedback signal to generate the phase-shifted IF feedback signal.

When the present invention is embodied as an amplifier/modulator, it preferably further comprises a second filter means arranged to filter the output of the differencing means. If the first filter has a bandwidth of $2B_2$ Hz and the second filter has a bandwidth of $2B_1$ Hz, and the values of $B_1$ and $B_2$ are selected to satisfy the following equation:

$$\frac{KB_1}{B_2} \leq \frac{1}{5},$$

where K is a dimensionless distortion reduction term representing the amount of distortion reduction desired.

An amplifier/modulator constructed as just described exhibits the same benefits as the linearized RF amplifier discussed above. Additionally, by inserting the second filter as described, the system is rendered stable outside the bandwidth of the first filter where the phase shifting means may not be able to correct for the rather severe phase shift beginning at the edges of the first filter bandwidth.

Finally, the second filter preferably includes a crystal packaged to have relatively high motional inductance and relatively small contacting electrodes. The output of a crystal so packaged is highly preferable for use as the second filter required by the present invention.

BRIEF DESCRIPTION OF THE DRAWING

FIG. 1 depicts a basic block diagram of system constructed in accordance with the present invention for linearizing an RF amplifier;

FIG. 2 depicts a basic block diagram of a typical SSB transmission system using the amplifier linearization system depicted in FIG. 1;

FIG. 3 depicts a block diagram of a mobile two-way radio unit of the SSB system configured as a transmitter;

FIG. 4 depicts a block diagram of the mobile two-way radio unit of the SSB system configured as a receiver;

FIGS. 5 depicts a block diagram showing the RF amplifier linearization system of the present invention;

FIG. 6 depicts a single crystal loop filter circuit employed by the linearization system of the present invention;

FIG. 9 depicts a simplfied detailed block diagram of a system depicted in FIG. 5.

DETAILED DESCRIPTION OF THE PREFERRED EMBODIMENT

Figure 7:
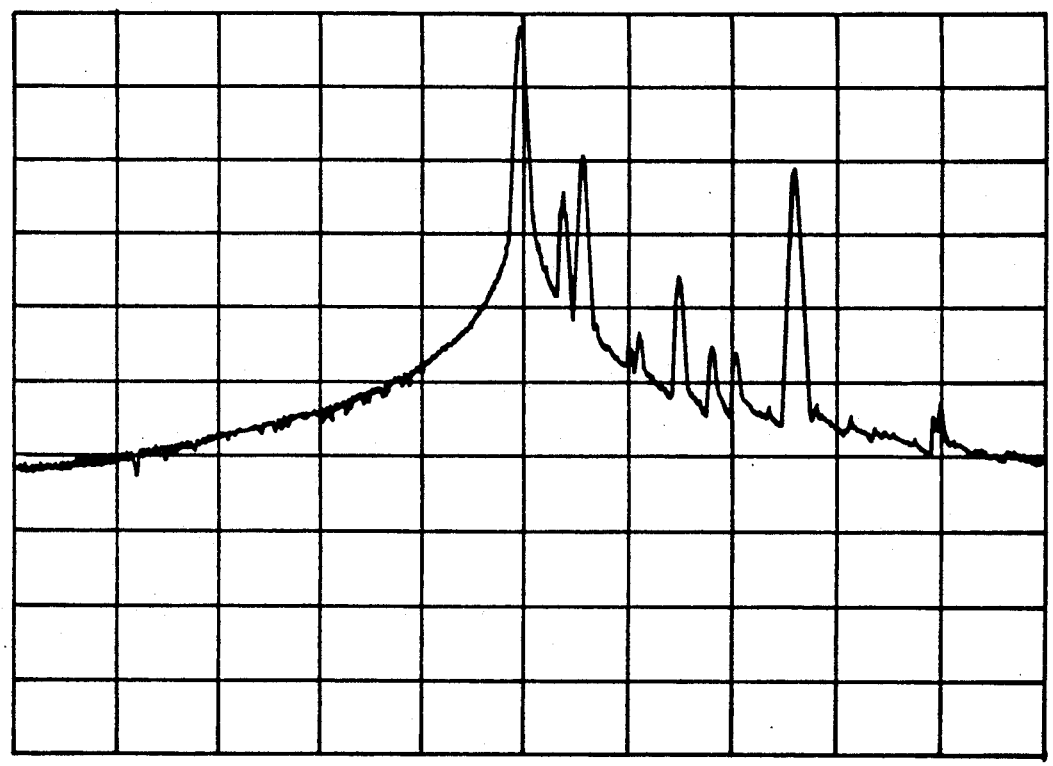
FIG. 7 depicts the output of a prior art single crystal loop filter.

Referring now to the drawing, schematically depicted in FIG. 1 is an amplifier linearization system constructed in accordance with, and embodying, the principles of the present invention. This system 2 generally comprises: (a) a difference determining circuit 4; (b) a bandpass filter 5, (c) an amplifier circuit 6; (c) a phase correction circuit 8; and (d) a phase correction amount determining circuit 9.

The system 2 depicted in FIG. 1 operates in the following basic manner. Initially, an input signal is introduced into the difference determining circuit 4. The difference determining circuit 4 generates an output signal that is filtered by the bandpass filter 5 and introduced into the amplifier circuit 6. The amplifier circuit 6 generates an amplified output signal corresponding to the filtered output signal. A feedback signal is derived from the amplified output signal. The phase correction circuit 8 shifts the phase of this feedback signal to generate a phase-shifted feedback signal. The phase correction amount determining circuit 9 determines the amount of phase correction required for the frequency at which the system 2 is operating. This phase-shifted feedback signal is introduced into the difference determining circuit 4. The output signal generated by this circuit 4 is the difference between the input signal and the phase-shifted feedback signal.

For the system 2 to remain stable, the phase of the fed back signal must be properly adjusted to achieve reduced distortion over the range of frequencies of the amplifier. Without the phase correction circuit 8 and phase correction amount circuit 9, the phase of the fed back signal will not be properly adjusted because the bandpass filter 5 and the amplifier circuit 6 cause relatively severe phase shift in the output signal.

More particularly, the phase of the phase-shifted feedback signal should be at or relatively near an integer multiple of 360 degrees relative to (i.e., in phase with) the input signal phase so that negative feedback will be obtained as a result of signal subtraction performed by the difference determining circuit 4. In the following discussion, the term 360° out of phase will be used to refer to 360° out of phase and integer multiples thereof. Negative feedback results in reduction of system gain and distortion. If the phase-shifted feedback signal is not nearly in phase with the input signal, there is a tendency toward positive feedback, causing system gain to increase which leads to system instability and unacceptable oscillations.

Therefore, the purpose of the phase correction circuit 8 and phase correction amount determining circuit 9 is to shift the phase of the feedback signal by a predetermined amount for a given frequency to compensate for the phase shift introduced by the bandpass filter 5 and the amplifier circuit 6. Because the introduced phase shift varies across the range of frequencies in which the amplifier circuit 6 is designed to operate, the phase correction amount determining circuit 9 varies the compensating phase shift introduced by the phase correction circuit 8 across this operating range.

To illustrate, if the amplifier circuit 6 has an operating range of 2 MHz, this 2 MHz range is divided into 40 regions that are each 50 KHz wide. The amount of phase shift introduced by the bandpass filter 5 plus the amplifier circuit 6 in each of these regions may be empirically determined. The amount of phase shift necessary to compensate for filter and amplifier introduced phase shift in each of these regions may then be calculated and stored in a table as a phase shift correction amount. When the system 2 is operating at any given operating frequency, the phase correction amount determining circuit 8 determines from the table the appropriate amount of phase shift required for that given frequency, and the phase correction circuit 8 shifts the phase of the feedback signal by the appropriate amount. The resulting phase-shifted feedback signal has thus been re-shifted in phase so that it is sufficiently close to 360° out of phase with the input signal to maintain system stability.

Because the phase of the fed back signal is corrected as described above, the present invention implements feedback control in a manner that eliminates or substantially reduces IMD while still maintaining a stable system.

Referring now to FIGS. 2–9, the present invention will be described in further detail in an environment in which it would typically be employed.

Referring now to FIG. 2, depicted therein is an SSB signal processing system 10. The system 10 generally comprises one or more mobile units $12_{1-n}$, a base station 14, and a trunking system controller 16. The system 10 was described in detail in a copending patent application Ser. No. 07/863,431, which is incorporated herein by reference, and thus will be discussed below only to the extent necessary for a complete understanding of the present invention.

Each mobile unit $12_{1-n}$ comprises a half-duplex transceiver 18, an antenna 20, a microphone 22, and a speaker 24. The base station 14 comprises one or more full-duplex repeaters $26_{1-m}$ each having an antenna 28. Each base station repeater 30 comprises a duplexer 34, a receiver 36, and a transmitter 38. The base station repeaters 26 are in communication with each other and with the trunking system controller 16.

The SSB system 10 basically operates in the following manner. The base station 14 periodically transmits trunking data on the base channel $C_B$ via the repeater $26_1$. The trunking data comprises information indicating channel availability and the identification codes of sending and receiving mobile units 12. Each latent mobile unit 12 monitors the trunking data transmitted on the base channel $C_B$. Each mobile unit 12 thus knows what channel is available for broadcast and whether another mobile unit 12 is attempting to communicate therewith.

Under the control of the trunking data broadcast by the base station 14, a transmitting mobile unit $12_1$ may broadcast a first SSB signal containing voice data and trunking data over an available channel $C_A$. The base station repeater $26_m$ receives this signal, passes trunking data contained therein to the trunking system controller 16, and transmits a second SSB signal containing the voice data and new trunking data.

A receiving mobile unit $18_n$ receives this second SSB signal and separates out the voice portion and the trunking data portion therefrom. The voice portion may be amplified and perceived by the user of the unit $18_n$, while the trunking data is monitored for further instructions from the trunking system controller 16.

An important aspect of the SSB system 10 described above is that more than one channel may be used at a time. Specifically, each channel comprises two 5 KHz portions separated by 1 MHz. A mobile unit 12 will broadcast over a given channel $C_x$ on one 5 KHz portion thereof and receive on the other 5 KHz portion thereof. At the same time, another of these mobile units 12 may be broadcasting and receiving on a channel $C_y$ adjacent to the channel $C_x$. The result is that, to make efficient use of the available spectrum, two mobile units 12 may simultaneously be broadcasting or receiving an SSB signal occupying most (approximately 4 KHz) of adjacent 5 KHz portions of the two adjacent channels $C_x$ and $C_y$. Accordingly, if either of the mobile transceivers 18 is emitting IMD signals, these IMD signals may fall into an adjacent channel. This would likely cause problems such as distortion of received signals and/or false receiver tuning.

Referring now to FIGS. 3 and 4, depicted therein are simplified block diagrams of the mobile transceivers 18 in receive and transmit modes, respectively. When the user wishes to transmit, switches are operated and software routines are called that place the transceivers 18 in the configuration shown in FIG. 3. In this configuration, the user speaks into the microphone 22 to generate a voice signal. A transmit baseband processing portion 30, a good deal of which is implemented in software run by a digital signal processor, compresses the voice signal and combines it with trunking data to generate a composite signal. The composite signal is translated to IF frequencies by a transmit IF modulator 32 and further processed by a transmit IF processing portion 34. The output of the processing portion 34 is an input signal. The input signal is applied to an RF amplifier/modulator 36 operating in a transmit mode. This RF amplifier/modulator 36 translates the input signal to a frequency in the RF range while at the same time amplifying this translated signal. The output of the RF amplifier/modulator 36 is identified in the drawing as the amplified RF output signal. This amplified RF output signal is then broadcast through the antenna 20.

The above-described process is essentially reversed when the transceiver 18 is in its receive mode. A received SSB signal picked up by the antenna 20 is amplified and demodulated by an RF demodulator/amplifier 38 (FIG. 4) operating in a receive mode. An IF signal generated by the demodulator/amplifier 38 is processed by a receive IF processing portion 40. The IF signal is then translated down to baseband frequencies. The baseband signal is processed by a receive baseband processing portion 44 to generate a trunking data signal and a voice signal. The voice signal is then converted to sound energy by the speaker 24 so that it may perceived by the user.

The present invention primarily relates to the RF amplifier/modulator 36 employed by the transceiver 18 in its transmit mode. This amplifier/modulator 36 is depicted in further detail in FIG. 5.

The modulator amplifier circuit 36 basically comprises an IF stage 46, an RF stage 48, and a feedback signal correcting circuit 50. This circuit 36 further comprises a first mixer 52 connected between the IF stage 46 and the RF stage 48 and a second mixer 54 connected between the RF stage 48 and the feedback signal correcting circuit 50. An electrically controlled local oscillator synthesizer 56 supplies an RF mixing signal to an input of both of the mixers 52 and 54. An attenuator 58 is connected between the output of the RF stage 48 and an input of the second mixer 54. A harmonic suppression filter 60 is connected between the output of the RF stage 48 and the antenna 20. The RF mixing signal is modulated by the IF output signal in the first mixer 52 to generate an RF output signal. The RF mixing signal is employed by the second mixer 54 to demodulate the RF feedback signal down in frequency to obtain an IF feedback signal.

The feedback signal correcting circuit 50 comprises a phase shifter 62, a digital to analog converter (DAC) 64, and a central processing unit (CPU) 66. The DAC 64 is conventional and will not be described in detail herein. The CPU 66 has volatile and non-volatile memory associated therewith for temporary and long-term storage of instructions and data. In particular, stored in non-volatile memory is a table associating frequency ranges with phase shift correction amounts. Thus, by determining which of these frequency ranges include a given operating frequency, the appropriate phase shift correction amount for that given operating frequency may be selected from the table stored by the CPU 66.

The phase shifter 62 is basically conventional and comprises a differential amplifier and an LC filter with a bandwidth of approximately 5 MHz. The differential amplifier takes the difference between a sample of its input signal and a signal filtered by the LC filter. The differential amplifier and LC filter form an all-pass filter that has only nominal effect on the amplitude of the signals passing therethrough; however, by electrically tuning the center frequency of the bandpass filter, the phase of the signal passing through the phase shifter 62 can be varied over a range approaching plus or minus 180°. The output of the DAC 64 is so connected to the phase shifter 62 that it controls the bandpass filter center frequency as described above.

The IF stage 46 comprises a differential amplifier 68, a single crystal loop filter 70, and an IF amplifier 72. The differential amplifier 68 and IF amplifier 72 are conventional and will not be discussed below in detail.

Figure 8:
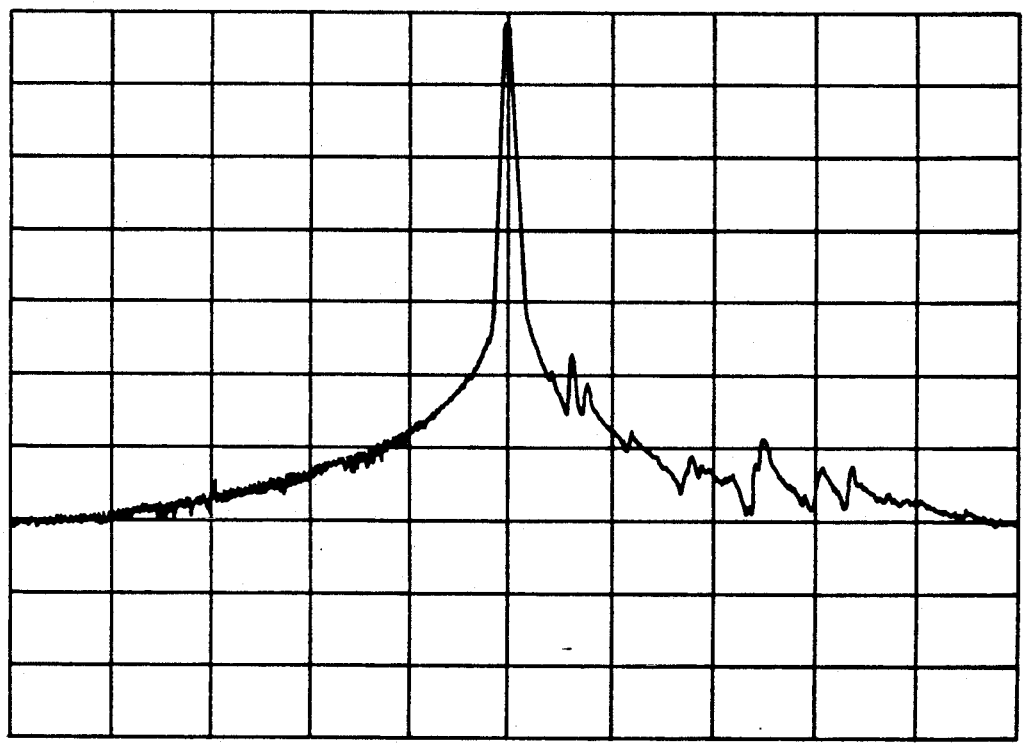
FIG. 8 depicts the output of the single crystal loop filter employed by the present invention.

The single crystal loop filter 70 is of unique construction, however, and warrants further discussion with reference to FIGS. 6–8. The loop filter 70 of the present invention is depicted in detail in FIG. 6. The loop filter 70 is a bandpass filter comprising an amplifier 80, a variable capacitor 82, and a crystal 84 having contacting electrodes 86 and 88. In the preferred embodiment, the loop filter 70 has a center frequency of 10.275 MHz and a bandwidth of 4 kHz. The variable capacitor 82 is adjusted in a known manner to eliminate the effects of parasitic capacitance introduced by the crystal 84.

The packaging of the crystal employed in the filter 70 is important to the operation of the loop filter 70. The output of a prior art crystal packaged for use as a frequency source, depicted in FIG. 7, contains relatively large spurious signals (17.5 dB below peak) that can cause oscillations in an amplifier circuit. The Applicant has determined, however, that the packaging of the crystal used in the loop filter 70 highly influences the generation of spurious signals such as those depicted in FIG. 7. Crystals designed for use as a frequency source have large contacting electrodes and relatively low motional inductance. The contacting electrodes 86 and 88 of the crystal 84 used in the loop filter 70, on the other hand, are relatively small, and the crystal 84 exhibits high motional inductance relative to the prior art crystal commonly used as a frequency source. As depicted in FIG. 8, the output of the crystal 84 manufactured as just described contains relatively small spurious signals (45.5 dB below peak). The crystal 84 having relatively small contacting electrodes 86 and 88 and relatively high motional inductance is therefore highly preferable in the amplifier/modulator circuit 36 to crystals designed for use as a frequency source.

Referring now back to FIG. 5, the RF stage 48 comprises a bi-directional RF amplifier 74, an image rejection filter 76, and an RF power amplifier 78. These elements are generally known and will not be discussed in great detail below. However, it should be noted that the power amplifier 78 comprises several individual amplifier stages cascaded together.

The image rejection filter 76 is a three-resonator helical bandpass filter that is centered at 221 MHz and has a total bandwidth of approximately 4 MHz. This 4 MHz range includes a two MHz allowance for a 2 MHz transmitter tuning range, as will be discussed below. This filter 76 exhibits considerable phase shift over this frequency range. This phase shift becomes even more pronounced outside of the band edge of the filter 76. As will be discussed in further detail below, this image rejection filter 76 is designed to reject one of the sidebands generated by the mixing process performed by the first mixer 52. As mentioned above, this image rejection filter 76 is the primary source of the phase shift that results in the positive feedback that causes system instabilities.

The amplifier/modulator 36 shown in FIG. 5 embodies the present invention as described above with reference to FIG. 1. Specifically, the difference determining circuit 4 comprises the differential amplifier 68, the amplifier circuit 6 comprises the RF power amplifier 78, the phase correction circuit 8 comprises the phase shifter 62 and the attenuator 58, and the phase correction amount determining means 9 comprises the DAC 64 and the CPU 66.

The operation of the circuit 36 will now be described in further detail. The input signal is generated by the transmit IF processing circuit 34. The input signal is an IF signal centered at an IF frequency of 10.275 MHz in the preferred embodiment. This input signal is applied to the . terminal of the differential amplifier 68, while the phase-shifted IF feedback signal generated as described below is applied to the - terminal of this amplifier 68. The output of the differential amplifier 68 is a first IF signal the amplitude of which is equal to the amplitude of the input signal minus the amplitude of the phase-shifted IF feedback signal. The first IF signal is filtered by the loop filter 70 and amplified by the IF amplifier 72 to generate an IF output signal.

The first mixer 52 then mixes the IF output signal with the RF mixing signal generated by the local oscillator synthesizer to generate a mixer output signal. More particularly, the CPU 66, in response to user frequency control data, generates a first digital signal that causes the local oscillator synthesizer 56 to generate the RF mixing signal at a frequency at any one of four hundred points within a 2 MHz frequency range. In the preferred embodiment, the RF mixing signal is in the range of 230.275 to 232.275 MHz. The mixer output signal comprises two sidebands at the RF mixing signal plus or minus the frequency of the IF output signal. In this case, the mixer output comprises one signal in the range of 220.00 to 222.00 MHz and one signal in the range of 240.55 to 242.55 MHz (230.275 to 232.275 MHz ±10.275 MHz).

The mixer output signal is amplified by the bidirectional RF amplifier 74 and filtered by the bandpass filter 76 to remove undesirable outputs from the first mixer 52, especially the 230–232 MHz oscillator frequency and the undesired sum (image) frequency at the IF frequency plus the frequency of the RF mixing signal (240–242). The image frequency must be removed for the feedback linearization system implemented by the circuit 36 effectively to reduce IMD. The resulting RF output signal is thus a SSB signal having an operating frequency in the range of 220 to 222 MHz.

The RF output signal is then further amplified by the RF power amplifier 78, filtered by the filter 60, and broadcast through the antenna 20.

An RF feedback signal is derived from the output of the RF power amplifier 78. Specifically, the output of the RF power amplifier 78 is coupled to the attenuator 58. The attenuator 58 reduces the magnitude of the RF feedback signal to the level required to drive the second mixer 54.

After the RF feedback signal is attenuated, the second mixer 54 mixes the RF feedback signal with the RF mixing signal generated by the local oscillator synthesizer 56. The output of the second mixer 54 is an IF feedback signal shifted back down to the same IF frequency as the input signal.

At the same time it generates the first digital signal to select an operating frequency, the CPU 66 looks up the amount of phase shift adjustment necessary to compensate for the amplifier phase shift at the selected operating frequency. The CPU 66 then generates a second digital signal corresponding to the necessary phase shift adjustment amount and sends this second digital signal to the DAC 64. The DAC 64 converts this second digital control signal into an analog control signal that causes the phase shifter 62 to adjust the phase of the IF feedback signal by the amount necessary to compensate for amplifier phase shift at the operating frequency. This phase shifted IF feedback signal is then applied to the - terminal of the differential amplifier 68.

As described above, the feedback signal correcting circuit 50 compensates for the phase shift introduced by the image rejection filter 76 to ensure that the feedback signal is at or near 360° out of phase with the input signal within the range of frequencies passed by the image rejection filter 76 to ensure negative feedback. However, outside of the image rejection filter bandwidth the phase distortion is too large to be compensated for by the correcting circuit 50. Accordingly, the parameters of the loop filter 70 must be so chosen in relation to the image rejection filter 76 that the system gain is below 1 (0 dB) at frequencies outside of the range for which the feedback signal correcting circuit 50 can correct for phase shifts introduced by the image rejection filter 76.

The loop parameters of the amplifier/modulator 36 are desirably chosen in the following manner. Referring first to FIG. 9, depicted therein is a simplified model of the amplifier/modulator circuit 36 constructed in accordance with the present invention. In its simplest form, this model comprises a differencing element 90, a loop filter element 92 having a response function $F_L(s)$ in the frequency domain, an amplifier 94 having a gain G, a summing element 96, and a feedback element 98 having a gain of $\beta$. $V_i$ is the input voltage, $V_o$ is the output voltage, and $V_D$ represents the distortion voltage introduced into the system by the quasi-linear amplifier in the RF stage 48. In this model, the differencing element corresponds to the differential amplifier 68, the loop filter element 92 corresponds to the loop filter 70, the amplifier 94 corresponds to the amplifiers 72, 74, and 78, and the feedback element 98 corresponds to the attenuator 58.

In designing the circuit 36, $V_o$ is first determined from the model depicted in FIG. 9; $V_o$ is represented by the following equation (1):

$$V_o = F_L G V_i - \beta F_L G V_o + V_D. \tag{1}$$

Rearranging the terms yields the following equation (2):

$$V_o = \frac{F_L G V_i}{1 + \beta F_L G} + \frac{V_D}{1 + \beta F_L G}, \tag{2}$$

where $\beta F_L G$ is known as the complex open loop gain.

Assuming the normal case in which $\beta F_L G$ is much greater than 1, $V_o$ may be calculated from the following equation (3):

$$V_o \approx \frac{V_i}{\beta} + \frac{V_D}{\beta F_L G}. \tag{3}$$

Equation (3) shows that the magnitude of the distortion voltage $V_D$ is reduced by a dimensionless distortion reduction term K provided by the following equation (4)

$$K = \beta G, \tag{4}$$

for frequencies within the passband of the loop filter 92 ($F_L = 1$).

From equations (3) and (4) it is clear that the distortion voltage $V_D$ can be reduced to a point where it is negligible. Equation (3) also indicates that the closed loop amplifier gain is approximately equal to $1/\beta$.

The following equation (5) for the complex open loop gain (OLG) of the system may be obtained by substituting in the response function of the filter element 92:

$$\text{Complex } OLG = \beta G \frac{B_1}{j\Delta f + B_1}, \tag{5}$$

where the bandwidth of the loop filter element 92 is equal to $2B_1$ Hz and $\Delta f$ represents the distance from filter center frequency in hertz.

From the definition of the distortion reduction term K in equation (4), the equation (5) giving the complex OLG may be rewritten as the following equation (6):

$$\text{Complex } OLG = \frac{KB_1}{j\Delta f + B_1}. \tag{6}$$

For the case in which $\Delta f$ is much greater than $B_1$, the magnitude of the OLG may be determined from the following equation (7) obtained from equation (6):

$$\text{Magnitude of } OLG = \frac{KB_1}{\Delta f} \tag{7}$$

Referring now back to FIG. 9, it can be seen that the image rejection filter 76 employed in the amplifier/modulator 36 is represented by the image rejection filter element 100. This image rejection filter element 100 has a bandwith of $2B_2$. In the system depicted in FIG. 9, the loop filter element 92 is the dominant filter, i.e., $B_1 << B_2$.

As discussed above, an important feature of the present invention is that open loop gain is less than 1 (0 dB) at the edges of the bandwidth of the image rejection filter element 100. To ensure that this condition is satisfied, the following equation (8) should be satisfied:

$$\frac{KB_1}{B_2} \leq \frac{1}{5}, \tag{8}$$

Equation 8 is obtained by choosing a gain margin (in this case, the amount by which the open loop gain falls below 0 dB at the image rejection filter bandwidth edges) that prevents phase shift introduced by the image rejection filter element 100 from causing undesirable positive feedback. In this case, the chosen gain margin is at least 14 dB ($20\log 1/5$).

However, within the constraints of equation (8), the values of K, $B_1$, and $B_2$ may be chosen as appropriate for a specific application. For example, in the preferred embodiment, the distortion reduction factor K is chosen to be 100 (40 dB). The loop filter 70 has a bandwidth of 4 KHz, resulting in $B_1$ being 2 KHz. $B_2$ must therefore be at least $5(100)(2 \times 10^3)$, or 1 MHz.

To complete the determination of the parameters of the system depicted in FIG. 9, the desired closed loop gain $1/\beta$ is chosen to be 56 dB, or 631 ($10^{(56/20)}$). The gain G of the amplifier 94 is next determined from equation (4) to be 100(631), or 63,100 (96 dB). $\beta$ is merely the inverse of the closed loop gain. Also, in the preferred embodiment, it is necessary to add a tuning range to the bandwidth of the image rejection filter 76. In this case, the tuning range is selected as 2 MHz, so the final image rejection filter bandwidth is 4 MHz.

Figure 10:
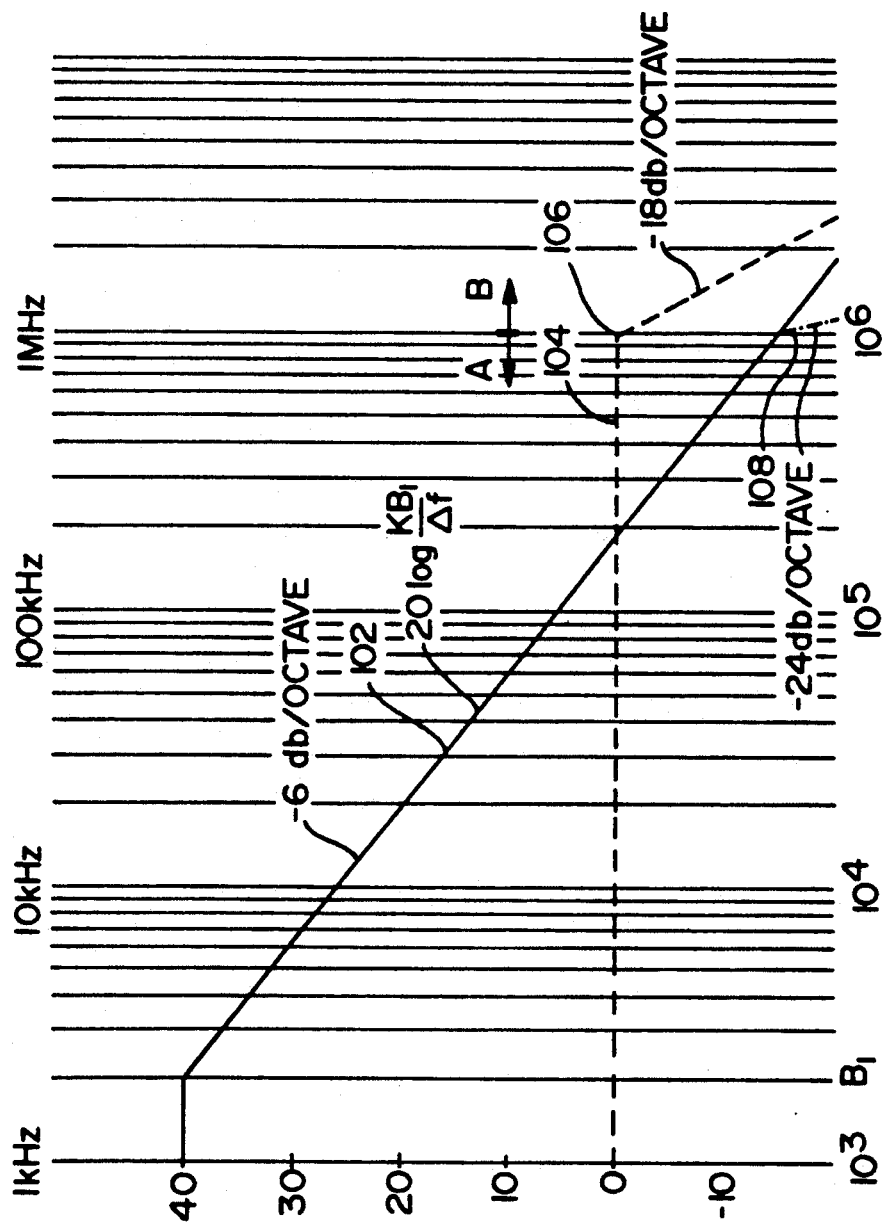
FIG. 10 depicts the frequency response curves of the filters employed in the system depicted in FIG. 5.

The situation algebraically described above is graphically depicted in FIG. 10. In FIG. 10, a frequency response curve 102 of the open loop gain including the loop filter 70 (solid lines) and frequency response curve 104 of the image rejection filter 76 (dashed lines) is plotted against $\Delta f$ as defined above. As shown in FIG. 10, the open loop gain response curve 102 is at $-14$ dB at the edge 106 of the image rejection filter frequency response curve 104. Shown at 108 in FIG. 10 is the composite frequency response curve (dashed/dotted line) that results from the combination of the loop filter 70 and image rejection filter 76.

Accordingly, the problem of excess phase shift introduced by the image rejection filter 76 is compensated by the feedback signal correcting circuit 50 within the bandwidth of this filter 76 (indicated by arrow A in FIG. 10) and by the gain margin provided by the loop filter 70 outside the image rejection filter bandwidth (indicated by arrow B in FIG. 10).

From the foregoing, it should be clear that the present invention may be embodied in forms other than that disclosed above without departing from the spirit or essential characteristics of the present invention. The above-described embodiment is therefore to be considered in all respects illustrative and not restrictive, the scope of the invention being indicated by the appended claims rather than the foregoing description. All changes that come within the meaning and scope of the claims are intended to be embraced therein.

I claim:

1. An apparatus for generating an amplified output signal form an input signal, comprising:
   a. phase-shifting mans for shifting the pase of a feedback signal derived from the amplified output signal in response to a control signal;
   b. differencing means for generating an output signal based on the input signal and the phase-shifted feedback signal;
   c. filtering means for filtering the output signal;
   d. power amplifying means for amplifying the filtered output signal to obtain the amplified output signal; and
   e. means for so generating the control signal according to a control signal value that the phase shifting means shifts the phase of the feedback signal as appropriate for an operating frequency of the output signal.

2. An apparatus as recited in claim 1, in which the control signal generating means comprises means for selecting the control signal value associated with a frequency range including the operating frequency from a table associating predetermined control signal values with frequency ranges in the portion of the frequency spectrum in which the amplifying means is designed to operate.

3. A linearized RF power amplifier/modulator for generating an amplified single sideband RF output signal from an IF input signal, comprising:
   a. differencing means for generating an IF output signal based on an IF input signal and a phase-shifted IF feedback signal;
   b. oscillating means for generating an RF mixing signal;
   c. first mixing means for mixing the IF output signal with the RF mixing signal to generate an RF mixer output signal;
   d. first filter means for filtering the RF mixer output signal to obtain a single sideband RF output signal;
   e. means for amplifying the single sideband RF output signal;
   f. means for generating an RF feedback signal based on the amplified RF output signal;
   g. second mixing means for mixing the RF feedback signal with the mixing signal to generate an IF feedback signal; and
   h. means for shifting the phase of the IF feedback signal to generate the phase-shifted IF feedback signal.

4. An amplifier/modulator as recited in claim 3, further comprising second filter means arranged to filter the output of the differencing means.

5. An amplifier/modulator as recited in claim 4, in which the first filter has a bandwidth of $2B_2$, the second filter has a bandwidth of $2B_1$, and the values of $B_1$ and $B_2$ are selected to satisfy the following equation:

$$\frac{KB_1}{B_2} \leq \frac{1}{5},$$

where K is a distortion reduction term representing the amount of distortion reduction desired.

6. An amplifier/modulator as recited in claim 5, in which the gain $\beta$ applied to the RF feedback signal and the gain G introduced by the amplifying means are defined by the following equation:

$$K = \beta G,$$

for frequencies within the passband of the second filter.

7. An amplifier/modulator as recited in claim 3, in which the phase shifting means shifts the phase of the IF feedback signal to prevent positive feedback.

8. An amplifier/modulator as recited in claim 3, in which the phase shifting means shifts the phase of the IF feedback signal in a manner that compensates for phase shift introduced by the first filter means within the bandwidth of the first filter means to prevent positive feedback.

9. An amplifier/modulator as recited in claim 8, further comprising a second filter means so arranged that system gain is reduced to less than 1 outside of the bandwidth of the first filter means to prevent positive feedback.

10. An amplifier/modulator as recited in claim 9, in which the parameters of the second filter means are so selected that system gain is at least 14 dB below 0 dB at the edge of the bandwidth of the first filter means.

11. An amplifier/modulator as recited in claim 9, in which the second filter comprises a crystal so packaged that it has high motional inductance.

12. An amplifier/modulator as recited in claim 11, in which the contacting electrodes of the crystal are relatively small.

13. An amplifier as recited in claim 3, in which the phase shifting means shifts the phase of the IF feedback signal based on a control signal, further comprising means for so generating the control signal according to a control signal value that the phase shifting means shifts the phase of the feedback signal as appropriate for an operating frequency of the output signal.

14. An amplifier as recited in claim 13, in which the control signal generating means comprises means for selecting the control signal value associated with a frequency range including the operating frequency from a table associating predetermined control signal values with frequency ranges in the portion of the frequency spectrum in which the amplifying means is designed to operate.

15. A method of linearizing an RF power amplifier/modulator which generates an amplified single sideband RF output signal from an IF input signal, comprising:
   a. generating an IF output signal based on an IF input signal and a phase-shifted IF feedback signal;
   b. filtering the IF output signal;
   c. generating an RF mixing signal;
   d. mixing the filtered IF output signal with the RF mixing signal to generate an RF mixer output signal;
   e. filtering the RF mixer output signal to obtain a single sideband RF output signal;
   f. amplifying the single sideband RF output signal;
   g. deriving an RF feedback signal from the amplified RF single sideband signal;
   h. mixing the RF feedback signal with the mixing signal to generate an IF feedback signal; and
   i. shifting the phase of the IF feedback signal to generate the phase-shifted IF feedback signal.

16. A method as recited in claim 15, further comprising the step of selecting system parameters K, $B_1$, and $B_2$ according to the following equation:

$$\frac{KB_1}{B_2} \leq \frac{1}{5},$$

where K is a distortion reduction term representing the amount of distortion reduction desired, $B_1$ is one-half of the bandwidth of a filter used in filtering the IF output signal, and $B_2$ is one-half of the bandwidth of a filter used in filtering the mixer output signal.

17. A method as recited in claim 15, further comprising the step of selecting system parameters $\beta$ and G according to the following equation:

$$K = \beta G,$$

for frequencies within the passband of a filter used in filtering the IF output signal, where $\beta$ is the gain applied to the RF feedback signal and the G is the gain introduced during the step of amplifying the single sideband signal.

* * * * *